(12) United States Patent
Xia et al.

(10) Patent No.: US 10,356,229 B2
(45) Date of Patent: Jul. 16, 2019

(54) FLEXIBLE WEARABLE DEVICE

(71) Applicant: SHENZHEN ROYOLE TECHNOLOGIES CO., LTD., Shenzhen, Guangdong (CN)

(72) Inventors: Xinyuan Xia, Guangdong (CN); Linyu Yu, Guangdong (CN); Songya Chen, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/067,588

(22) PCT Filed: Dec. 31, 2015

(86) PCT No.: PCT/CN2015/100171
§ 371 (c)(1),
(2) Date: Jun. 29, 2018

(87) PCT Pub. No.: WO2017/113319
PCT Pub. Date: Jul. 6, 2017

(65) Prior Publication Data
US 2019/0158639 A1    May 23, 2019

(51) Int. Cl.
*H04M 1/00* (2006.01)
*H04M 1/02* (2006.01)
(Continued)

(52) U.S. Cl.
CPC ............... *H04M 1/021* (2013.01); *A45F 5/00* (2013.01); *H04R 1/02* (2013.01); *H05K 1/028* (2013.01); *A45F 2200/0516* (2013.01)

(58) Field of Classification Search
CPC ......... H04M 1/021; H05K 1/028; H04R 1/02; A45F 5/00; A45F 2200/0516
(Continued)

(56) References Cited

U.S. PATENT DOCUMENTS 9,427,053 B2 * 8/2016 Proud .................. A44C 5/0015
9,989,770 B2 * 6/2018 Yang .................. G02B 27/0176
(Continued)

FOREIGN PATENT DOCUMENTS

CN     101668086 A     3/2010
CN     101739171 A     6/2010
(Continued)

OTHER PUBLICATIONS

International search report issued in corresponding international application No. PCT/CN2015/100171 dated Aug. 30, 2016.

*Primary Examiner* — Marceau Milord
(74) *Attorney, Agent, or Firm* — Hauptman Ham, LLP

(57) ABSTRACT

A flexible wearable device includes a flexible body, a speaker, an earpiece, a sensor, and a control unit. The flexible body can be in a worn state in which a bending angle of the flexible body is not less than a predetermined angle, and in a flattened state in which the bending angle of the flexible body is less than the predetermined angle. When the sensor senses that the flexible body is in the worn state, the control unit controls the earpiece to be off and controls the speaker to be on or as a default sound generator, and when the sensor senses that the flexible body is in the flattened state, the control unit controls the earpiece to be on or as the default sound generator, and controls the speaker to be off.

13 Claims, 9 Drawing Sheets

(51) Int. Cl.
*H05K 1/02* (2006.01)
*H04R 1/02* (2006.01)
*A45F 5/00* (2006.01)

(58) Field of Classification Search
USPC ............ 455/556.2, 90.3, 575.1, 575.2, 575.6
See application file for complete search history.

(56) References Cited

U.S. PATENT DOCUMENTS

| | | | | |
|---|---|---|---|---|
| 10,042,168 | B2* | 8/2018 | Yang | G02B 27/0176 |
| 10,095,037 | B2* | 10/2018 | Yang | G02B 27/0176 |
| 10,222,617 | B2* | 3/2019 | Jannard | G02C 11/06 |
| 10,225,641 | B2* | 3/2019 | Yang | G06F 1/163 |
| 2009/0115687 | A1* | 5/2009 | Chiaki | G02B 27/0176 |
| | | | | 345/8 |
| 2010/0245585 | A1* | 9/2010 | Fisher | H04M 1/6066 |
| | | | | 348/164 |
| 2011/0241998 | A1* | 10/2011 | McKinney | G06F 1/1616 |
| | | | | 345/168 |
| 2013/0229508 | A1* | 9/2013 | Li | G06F 1/3287 |
| | | | | 348/77 |
| 2014/0176398 | A1* | 6/2014 | West | G02B 27/0176 |
| | | | | 345/8 |
| 2014/0245784 | A1* | 9/2014 | Proud | A44C 5/0015 |
| | | | | 63/1.11 |
| 2014/0249760 | A1* | 9/2014 | Proud | A61B 5/443 |
| | | | | 702/19 |
| 2015/0135410 | A1* | 5/2015 | Wu | A44C 5/18 |
| | | | | 2/338 |
| 2015/0378391 | A1* | 12/2015 | Huitema | G06F 1/163 |
| | | | | 361/679.03 |
| 2016/0058375 | A1* | 3/2016 | Rothkopf | G06F 1/1643 |
| | | | | 600/301 |
| 2017/0235341 | A1* | 8/2017 | Huitema | G06F 1/163 |
| | | | | 361/679.03 |

FOREIGN PATENT DOCUMENTS

| | | |
|---|---|---|
| CN | 102905033 A | 1/2013 |
| CN | 203119972 U | 8/2013 |
| CN | 103763441 A | 4/2014 |
| CN | 203720703 U | 7/2014 |
| CN | 104007655 A | 8/2014 |
| CN | 104883421 A | 9/2015 |
| JP | 2015226204 A | 12/2015 |

* cited by examiner

FLEXIBLE WEARABLE DEVICE

RELATED APPLICATIONS

The present application is a National Phase of International Application Number PCT/CN2015/100171, filed Dec. 31, 2015.

TECHNICAL FIELD

The present disclosure relates to the field of electronic technology, and particularly to a flexible wearable device.

BACKGROUND

In recent years, wearable smart devices especially flexible wearable devices attract more and more researches and uses. The flexible wearable device such as flexible cellphone can be worn on a user's waist, and also can be taken off from the waist, which is convenient to carry. When the flexible cellphone is worn on a waist, the user usually lifts his waist so as to raise the flexible cellphone worn on the waist to make a call, puts the flexible cellphone beside an ear to answer a call, and moves the flexible cellphone beside the mouth to speak. In the whole process of the call, the user needs to frequently move his waist back and forth, which is troublesome.

SUMMARY

A technical problem to be solved in embodiments of the present disclosure is to provide a flexible wearable device. The flexible wearable device includes a flexible body, a speaker, an earpiece, a sensor, and a control unit. The flexible body can be in a worn state in which a bending angle of the flexible body is not less than a predetermined angle, and in a flattened state in which the bending angle of the flexible body is less than the predetermined angle. The sensor senses whether the flexible body is in one of the worn state and the flattened state. When the sensor senses that the flexible body is in the worn state, the control unit controls the earpiece to be off, and controls the speaker to be on or as a default sound generator, and when the sensor senses that the flexible body is in the flattened state, the control unit controls the earpiece to be on or as the default sound generator, and controls the speaker to be off.

When the flexible body is in the worn state, the speaker outputs an audio at a relatively high decibel level, thus a user does not need to place the flexible wearable device beside an ear when using the flexible wearable device, and does not need to frequently move the flexible wearable device, which is relatively convenient in use. Moreover, since the earpiece is off, interference of the earpiece on other electronic elements of the flexible wearable device is further reduced, and the call quality of the flexible wearable device in communication is improved.

BRIEF DESCRIPTION OF THE DRAWINGS

In order to illustrate technical solutions of embodiments of the present disclosure more clearly, accompanying drawings used in the embodiments will be briefly described below. Apparently, the accompanying drawings described in the following are some embodiments of the present disclosure, and a person ordinarily skilled in the art still can obtain other accompanying drawings according to these accompanying drawings without any creative effort.

DETAILED DESCRIPTION

Below technical solutions of embodiments of the present disclosure will be described clearly and completely in conjunction with the accompanying drawings of the embodiments of the present disclosure. Apparently, the embodiments described are merely some but not all embodiments of the present disclosure. Based on the embodiments in the present disclosure, all other embodiments, obtained by a person ordinarily skilled in the art without any creative effort, fall within the scope of protection of the present disclosure.

It should be indicated that terms used in the embodiments of the present disclosure are merely for the purpose of describing specific embodiments, rather than limiting the present disclosure. Singular forms "a (an)", "the", and "this" used in the embodiments of the present disclosure and the claims attached also aim at including plural forms, unless otherwise clearly indicated in the context. It also should be understood that the term "and/or" used in the present text refers to and contains any or all possible combinations of one or more associated listed items. Besides, terms such as "first", "second", "third", and "fourth" in the description, the claims, and the above accompanying drawings of the present disclosure are used to distinguish different objects, but are not used to describe a specific order. Besides, terms "comprise (include)" and "have" and any of their variants are intended to cover non-exclusive containing, for example, a process, a method, a system, a product or a device containing a series of steps or units is not limited to those listed steps or units, but optionally includes other steps or units which are not listed or optionally further includes other steps or units inherent to those process, method, product or device.

Below technical solutions of embodiments of the present disclosure will be described clearly and completely in conjunction with the accompanying drawings of the embodiments of the present disclosure. Apparently, the embodiments described are merely some but not all embodiments of the present disclosure. Based on the embodiments in the present disclosure, all other embodiments, obtained by a person ordinarily skilled in the art without any creative effort, fall within the scope of protection of the present disclosure.

Figure 1:
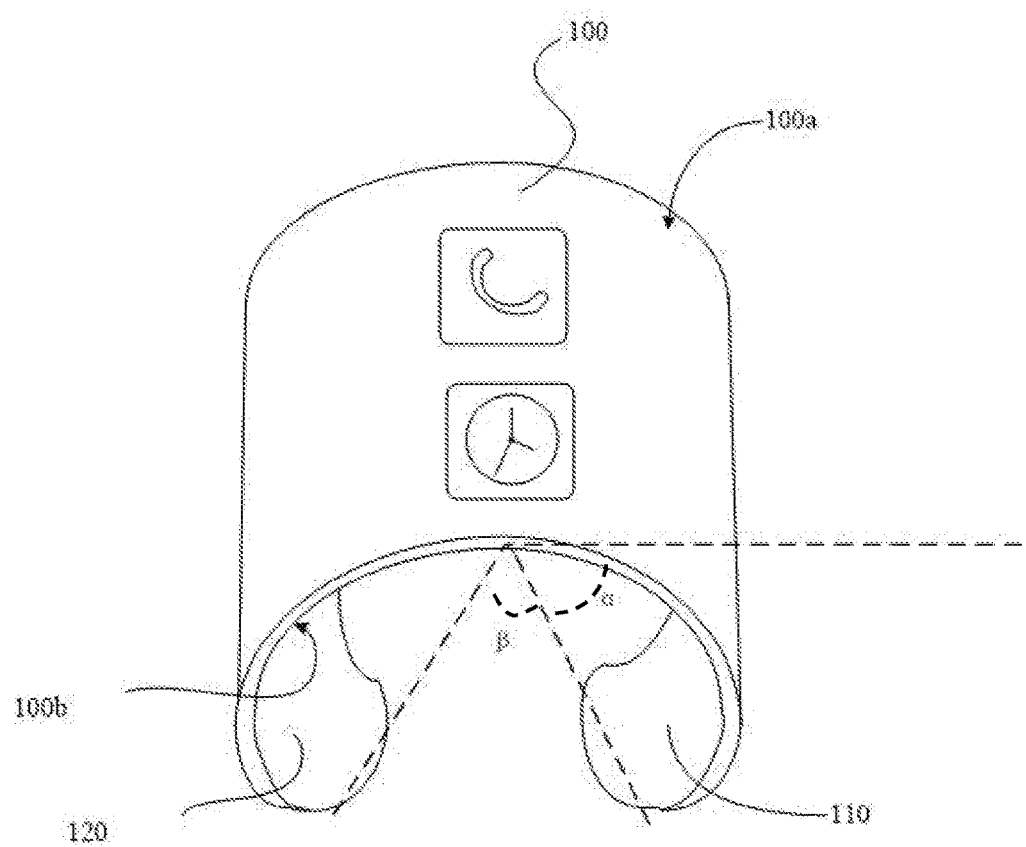
FIG. 1 is a structural schematic view of a flexible wearable device according to a preferred embodiment of the present disclosure, showing the flexible wearable device in a worn state.
Figure 2:
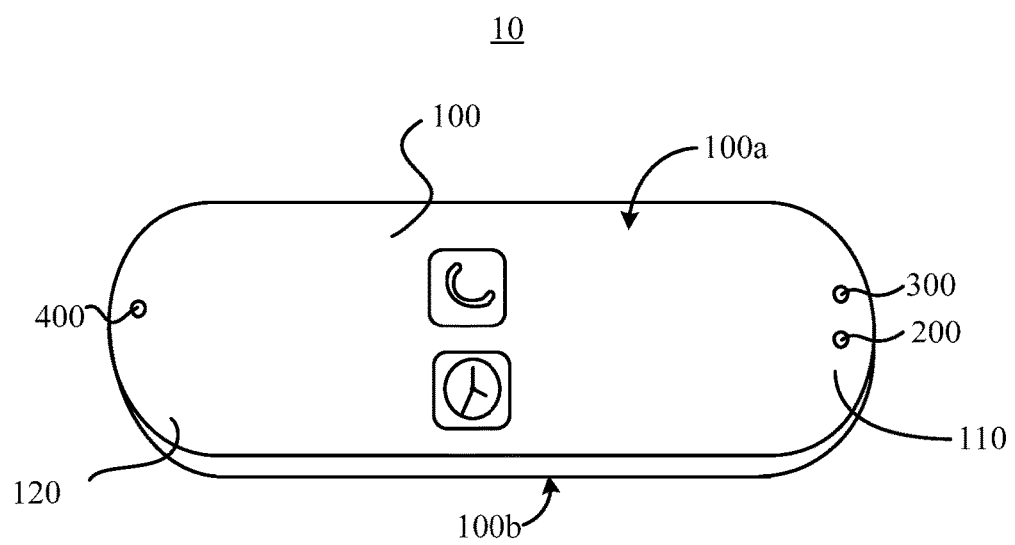
FIG. 2 is a structural schematic view of the flexible wearable device according to a preferred embodiment of the present disclosure, showing the flexible wearable device in a flattened state.
Figure 3:
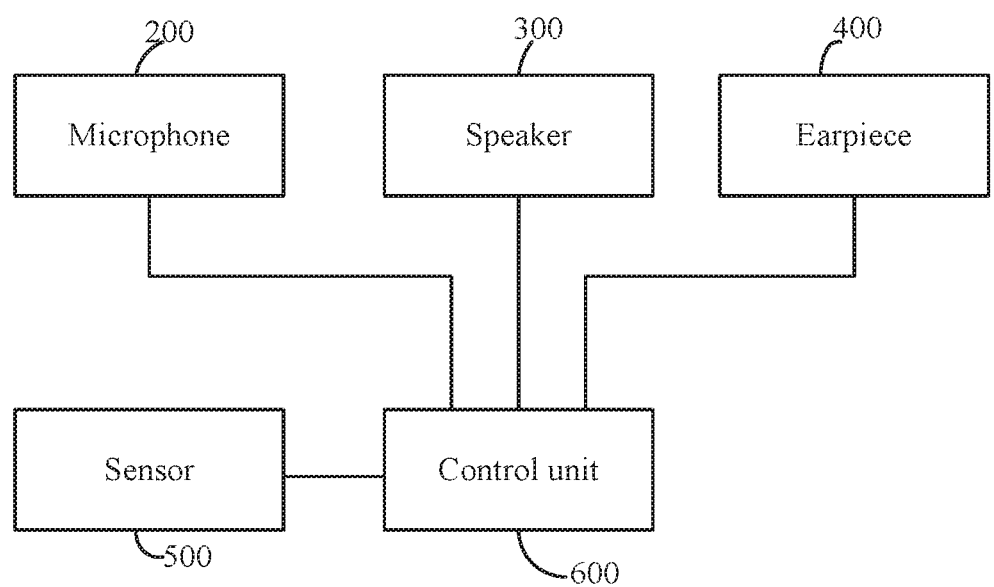
FIG. 3 is a diagram view of the flexible wearable device according to a preferred embodiment of the present disclosure, showing electronic elements of the flexible wearable device.

Referring to FIG. 1. FIG. 2, and FIG. 3, FIG. 1 is a structural schematic view of a flexible wearable device according to a preferred embodiment of the present disclosure, showing the flexible wearable device in a worn state; FIG. 2 is a structural schematic view of the flexible wearable device according to a preferred embodiment of the present disclosure, showing the flexible wearable device in a flattened state; FIG. 3 is a structural schematic diagram of the flexible wearable device according to a preferred embodiment of the present disclosure, showing electronic elements of the flexible wearable device. The flexible wearable device 10 can be, but not merely limited to, a communication device such as a flexible cellphone, and in the following embodiments, the flexible cellphone is described as embodiments. The flexible wearable device 10 includes a flexible body 100, a microphone 200, a speaker 300, an earpiece 400, a sensor 500, and a control unit 600. The flexible body 100 can be in the worn state in which a bending angle of the flexible body 100 is not less than a predetermined angle, and in the flattened state in which the bending angle of the flexible body 100 is less than the predetermined angle. The flexible body 100 includes a first end 110 and a second end 120 opposite to the first end 110. The microphone 200 and the speaker 300 are arranged at the first end 110, and the earpiece 400 is arranged at the second end 120. The sensor 500 is configured to sense whether the flexible body 100 is in one of the worn state and the flattened state. When the sensor 500 senses that the flexible body 100 is in the worn state, the control unit 600 controls the earpiece 400 to be off, and controls the speaker 300 to be on or as a default sound generator; when the sensor 500 senses that the flexible body 100 is in the flattened state, the control unit 600 controls the earpiece 400 to be on or as the default sound generator, and controls the speaker 300 to be off. In other embodiments, the speaker 300 also can be arranged at other places, for example, a side face of the flexible wearable device 10.

Besides, when the flexible wearable device 10 is not a cellphone, it is unnecessary to provide the microphone 200.

In an embodiment, the predetermined angle is an angle defined by one position of one end portion of the flexible body 100 in the flattened state and the same position of the same end portion in the worn state with respect to a middle of the flexible body 100, and the predetermined angle is larger than or equal to 30 degrees. For example, an angle α in FIG. 1 just indicates the angle defined above.

In another embodiment, the predetermined angle is an angle defined by two end portions of the flexible body 100 with respect to the middle of the flexible body 100 when the flexible body 100 is in the worn state, and the predetermined angle is larger than or equal to 90 degrees. For example, an angle β in FIG. 1 just indicates the angle defined above.

Below the working principle of the flexible device is described in detail by taking an example that the flexible wearable device is a flexible cellphone. When the sensor 500 senses the worn state, the control unit 600 controls the earpiece 400 to be off, and controls the speaker 300 to be on or as the default sound generator. Since the speaker 300 outputs an audio at a relatively high decibel level, at this point, a user does not need to put the flexible cellphone beside an ear when making a call, therefore, the user does not need to move his waist frequently. When the sensor 500 senses the flattened state, the control unit 600 controls the earpiece 400 to be on or as the default sound generator, and controls the speaker 300 to be off. When the flexible body 100 is in the flattened state, the user can take the flexible cellphone in a hand, and when making a call, the user can place an end of the flexible cellphone provided with the earpiece 400 beside the ear, and place an end provided with the microphone 200 beside the mouth.

Figure 4:
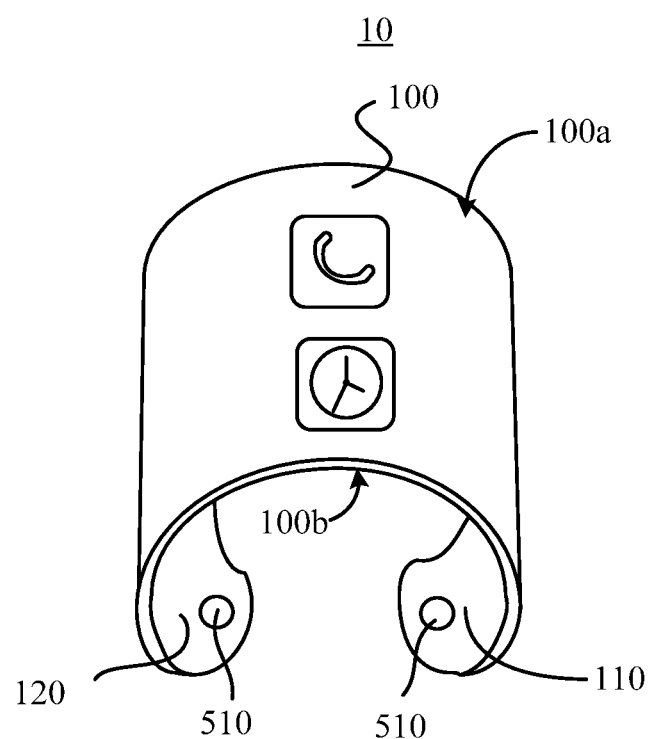
FIG. 4 is a structural schematic view of the flexible wearable device according to a preferred embodiment of the present disclosure, showing a sensor of the flexible wearable device including a heart rate sensor.
Figure 5:
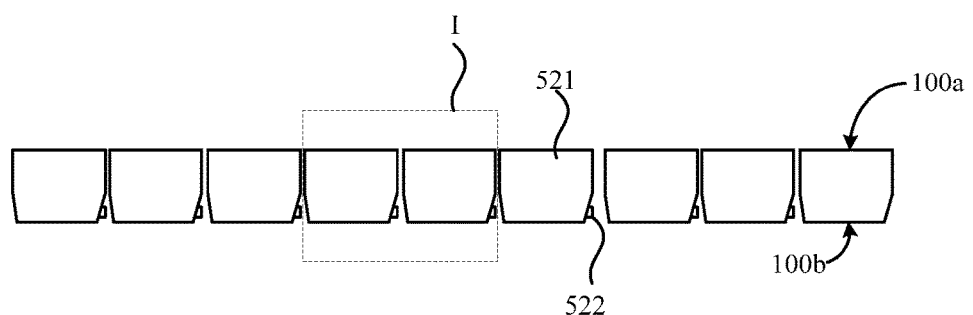
FIG. 5 is a structural schematic view of a flexible body of the flexible wearable device according to a preferred embodiment of the present disclosure, showing the flexible body in the flattened state.

Referring to FIG. 4, FIG. 4 is a structural schematic view of the flexible wearable device according to a preferred embodiment of the present disclosure, showing the sensor including a heart rate sensor. In the embodiment, the sensor 500 includes a heart rate sensor 510 for sensing a user's heart rate. When the heart rate sensor 510 senses the user's heart rate, the flexible body 100 is in the worn state, and when the heart rate sensor 510 does not sense the user's heart rate, the flexible body 100 is in the flattened state.

In the embodiment, the flexible body 100 includes a first surface 100a and a second surface 100b opposite to the first surface 100a. When the flexible body 100 is in the worn state, the first surface 100a is an outer surface of the flexible body 100, the second surface 100b is an inner surface of the flexible body 100, and the heart rate sensor 510 is arranged on the second surface 100b of the flexible body 100.

Figure 6:
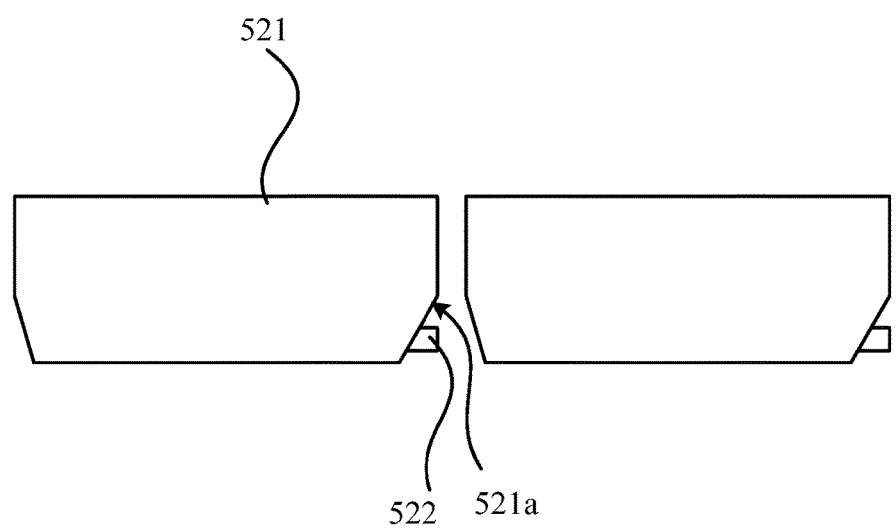
FIG. 6 is an enlarged schematic view of a portion I in FIG. 5.
Figure 7:
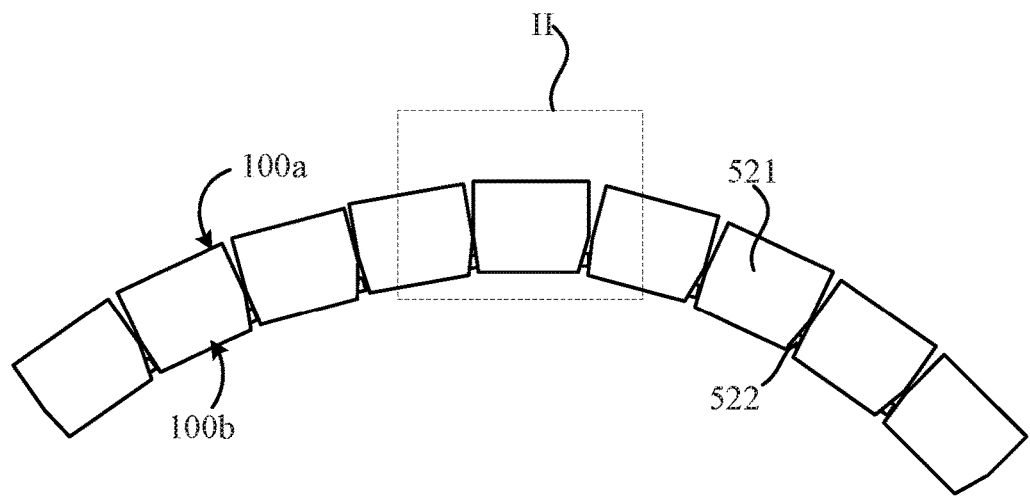
FIG. 7 is a structural schematic view of the flexible body of FIG. 5, showing the flexible body in the worn state, and merely showing a part of the flexible body in the figure.
Figure 8:
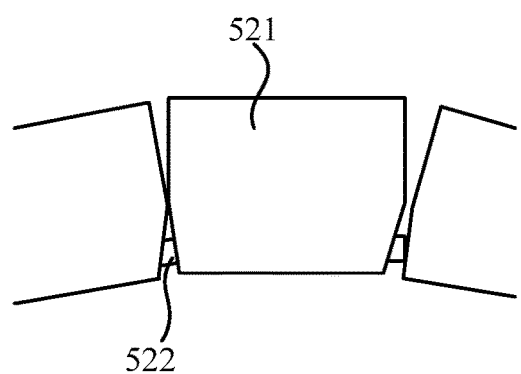
FIG. 8 is an enlarged schematic view of a portion II in FIG. 5.

Referring to FIG. 5 to FIG. 8, FIG. 5 is a structural schematic view of the flexible body of the flexible wearable device according to a preferred embodiment of the present disclosure, showing the flexible body in the flattened state; FIG. 6 is an enlarged schematic view of a portion I in FIG. 5; FIG. 7 is a structural schematic view of the flexible body of the flexible wearable device according to a preferred embodiment of the present disclosure, showing the flexible body in the worn state; FIG. 8 is an enlarged schematic view of a portion II in FIG. 5. In the embodiment, the flexible body 100 includes the first surface 100a and the second surface 100b opposite to the first surface 100a. When the flexible body 100 is in the worn state, the first surface 100a is the outer surface of the flexible body 100, and the second surface 100b is the inner surface of the flexible body 100. The flexible body 100 includes a number of hinging bodies 521 hinged with each other, and each hinging body 521 includes at least one inclined face 521a facing an adjacent hinging body 521 and adjacent to the second face 100b. The sensor 500 includes a number of elastic bodies 522 each arranged on the inclined face 521a. Each elastic body 522 contacts an adjacent hinging body 521 when the flexible body 100 is in the worn state, and a space is defined between each elastic body 522 and an adjacent hinging body 521 when the flexible body 100 is in the flattened state. The sensor 500 senses whether the flexible body 100 is in the flattened state or the worn state through the elastic bodies 522.

Figure 9:
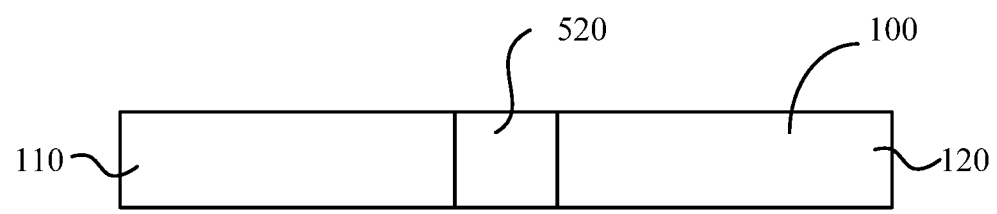
FIG. 9 is a structural schematic view of the flexible wearable device according to a preferred embodiment of the present disclosure, showing the sensor including a piezoelectric transducer, and showing the flexible wearable device in the flattened state.
Figure 10:
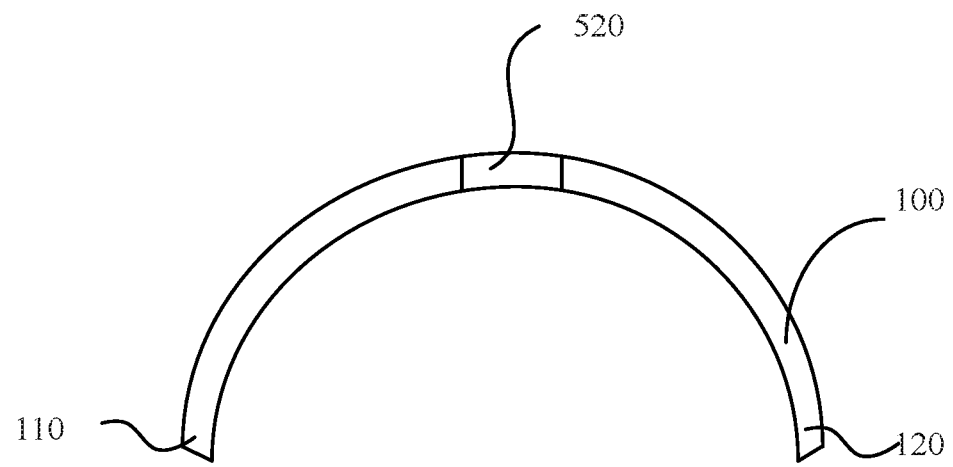
FIG. 10 is a structural schematic view of the flexible wearable device of FIG. 9, showing the flexible wearable device in the worn state, and merely showing a part of the flexible wearable device in the figure.

Referring to FIG. 9 and FIG. 10, FIG. 9 is a structural schematic view of the flexible wearable device according to a preferred embodiment of the present disclosure, showing the sensor including a piezoelectric transducer; FIG. 10 is a structural schematic view of the flexible wearable device according to a preferred embodiment of the present disclosure, showing the sensor including the piezoelectric transducer, and showing the flexible wearable device in the worn state. In the embodiment, the sensor 500 includes a piezoelectric transducer 520, and the piezoelectric transducer 520 is arranged in the flexible body 100. When a pressure sensed by the piezoelectric transducer 520 is greater than or equal to a predetermined pressure, the flexible body 100 is in the worn state, and when the pressure sensed by the piezoelectric transducer 520 is less than the predetermined pressure, the flexible body 100 is in the flattened state. Preferably, the piezoelectric transducer 520 is arranged at a part of the flexible body 100 that deforms when the worn state and the flattened state are changed. In the embodiment, the piezoelectric transducer 520 is arranged at the middle of the flexible body 100. When the flexible body 100 is in the worn state, the pressure of the middle of the flexible body 100 has the greatest change, while the pressure of the first end 110 of the flexible body 100 and the pressure of the second end 120 of the flexible body 100 have the smallest changes, thus the piezoelectric transducer 520 is arranged at the middle of the flexible body 100 so as to increase the sensitivity of the piezoelectric transducer 520 when sensing pressure. In another embodiment, the flexible body 100 can be divided into two disconnected parts, and the piezoelectric transducer 520 is arranged between the two disconnected parts and connects the two disconnected parts of the flexible body 100.

Figure 11:
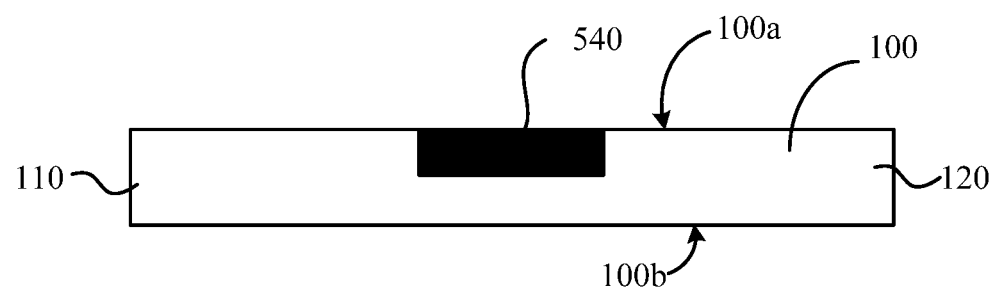
FIG. 11 is a structural schematic view of the flexible wearable device according to a preferred embodiment of the present disclosure, showing the sensor including a thin-film resistor, and showing the flexible wearable device in the flattened state.
Figure 12:
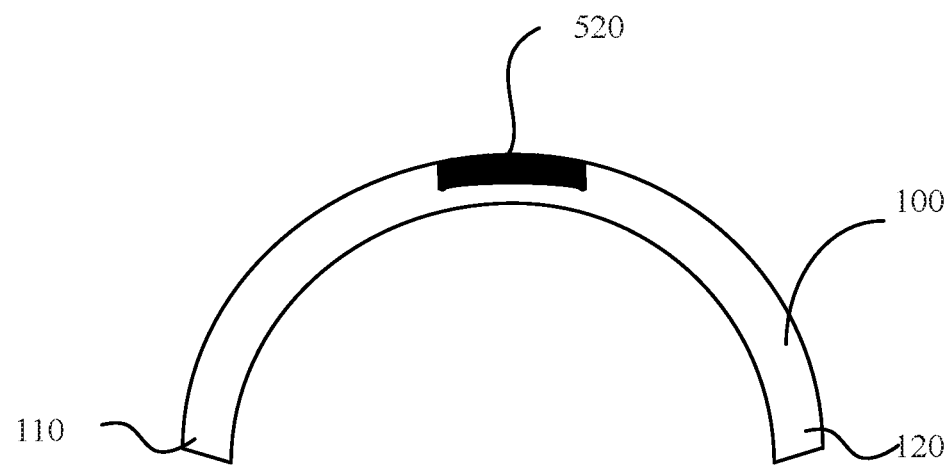
FIG. 12 is a structural schematic view of the flexible wearable device of FIG. 11, showing the flexible wearable device in the worn state, and merely showing a part of the flexible wearable device in the figure.

Referring to FIG. 11 and FIG. 12, FIG. 11 is a structural schematic view of the flexible wearable device according to a preferred embodiment of the present disclosure, showing the sensor including a thin-film resistor, and showing the flexible wearable device in the flattened state; FIG. 12 is a structural schematic view of the flexible wearable device according to a preferred embodiment of the present disclosure, showing the sensor including the tinfoil resistor, and showing the flexible wearable device in the worn state. The sensor 500 includes a tinfoil resistor 540 arranged in the flexible body 100. When a change of the resistance value of the tinfoil resistor 540 is greater than or equal to a predetermined threshold, the flexible body 100 is in the worn state; when the change of the resistance value of the tinfoil resistor 540 is less than the predetermined threshold, the flexible body 100 is in the flattened state. In the embodiment, the flexible body 100 includes the first surface 100a and the second surface 100b opposite to the first surface 100a When the flexible body 100 is in the worn state, the first surface 100a is the outer surface of the flexible body 100, and the second surface 100b is the inner surface of the flexible body 100; the tinfoil resistor 540 is arranged at a part of the first surface 100a that deforms when the worn state and the flattened state are changed. In the embodiment, the tinfoil resistor 540 is arranged at a middle of the first surface 100a. The deformation of the tinfoil resistor 540 causes changes of the resistance value. When the flexible body 100 changes, a deformation quantity of the middle of the flexible body 100 is greater than that of two ends of the flexible body 100, and for the middle of the flexible body 100, the deformation quantity of the middle of the first surface 100a of the flexible body 100 is greater than that of the second surface 100b of the flexible body 100. Therefore, the tinfoil resistor 540 is arranged at the middle of the first surface 100a of the flexible body 100 so as to increase the sensing accuracy of the tinfoil resistor 540 when sensing the resistance value.

Figure 13:
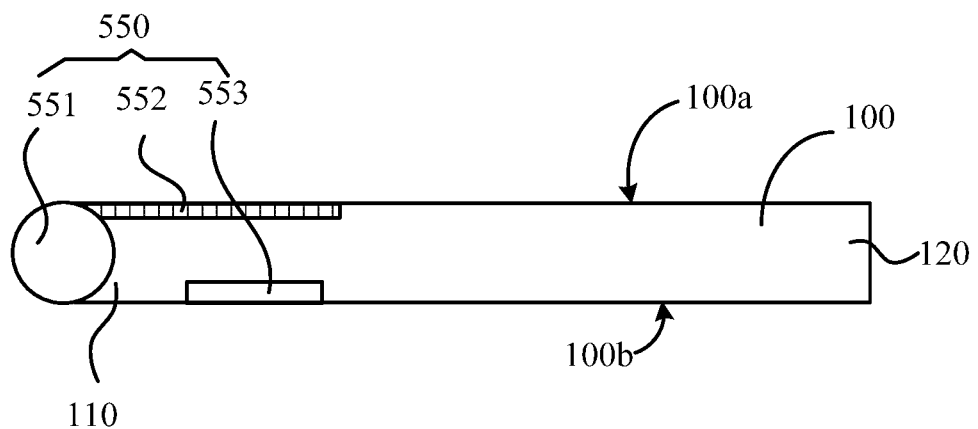
FIG. 13 is a structural schematic view of the flexible wearable device according to a preferred embodiment of the present disclosure, showing the sensor including a displacement transducer, and showing the flexible wearable device in the flattened state.
Figure 14:
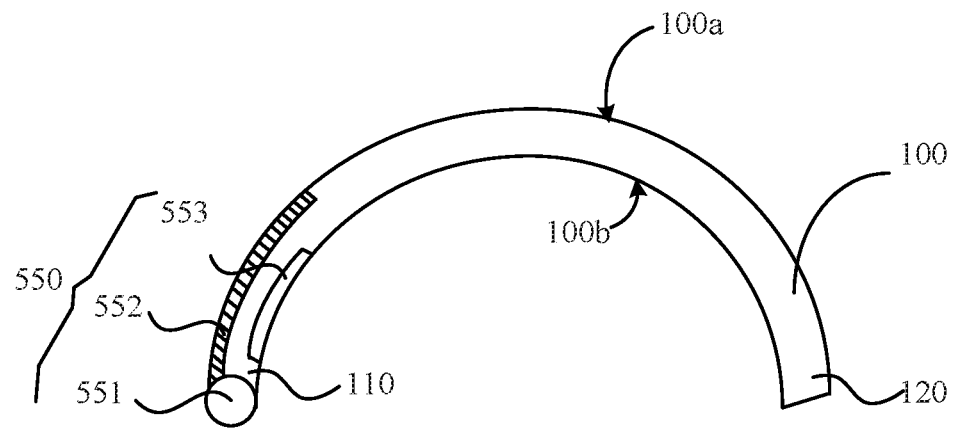
FIG. 14 is a structural schematic view of the flexible wearable device of FIG. 13, showing the flexible wearable device in the worn state, and merely showing a part of the flexible wearable device in the figure.

Referring to FIG. 13 and FIG. 14, FIG. 13 is a structural schematic view of the flexible wearable device according to a preferred embodiment of the present disclosure, showing the sensor including a displacement transducer, and showing the flexible wearable device in the flattened state; FIG. 14 is a structural schematic view of the flexible wearable device according to a preferred embodiment of the present disclosure, showing the sensor including the displacement transducer, and showing the flexible wearable device in the worn state. In the embodiment, the flexible body 100 includes the first surface 100a and the second surface 100b opposite to the first surface 100a. When the flexible body 100 is in the worn state, the first surface 100a is the outer surface of the flexible body 100, the second surface 100b is the inner surface of the flexible body 100. The sensor 500 includes a displacement transducer 550, and the displacement transducer is configured to sense a displacement quantity of the first surface 100a with respect to the second surface 100b. The displacement transducer 550 includes a reel 551, a scaling portion 552, and a sensing portion 553. The reel 551 is arranged at an end of the flexible body 100. The scaling portion 552 has one part wound on the first surface 100a, and another part capable of being wound to the reel 551 or expanded from the reel 551 with the deformation of the flexible body 100. In FIG. 13 and FIG. 14, the reel 551 is arranged at the first end 110 of the flexible body 100. The sensing portion 553 is used to sense a length of expansion of the scaling portion 552 from the reel 551. When the length is greater than or equal to a predetermined length, the flexible body 100 is in the worn state; when the length is less than the predetermined length, the flexible body 100 is in the flattened state.

Compared with the prior art, the flexible wearable device 10 of the present disclosure includes the flexible body 100, the speaker 300, the earpieces 400, the sensor 500, and the control unit 600. The flexible body 100 can be in the worn state in which the bending angle of the flexible body 100 is not less than the predetermined angle, and in the flattened state in which the bending angle of the flexible body 100 is less than the predetermined angle. When the sensor 500 senses the worn state, the control unit 600 controls the speaker 300 to be on or as the default sound generator, and when the sensor 500 senses the flattened state, the control unit 600 controls the earpieces 400 to be on or as the default sound generator, and controls the speaker 300 to be off. It can thus be seen that when the flexible body 100 is in the worn state, the speaker 300 outputs an audio at a relatively high decibel level, thus a user does not need to place the flexible wearable device 10 beside an ear when using the flexible wearable device, and does not need to frequently move the flexible wearable device, which is relatively convenient in use; moreover, since the earpieces 400 is off, interference of the earpieces 400 on other electronic elements of the flexible wearable device 10 is further reduced, and accordingly the call quality of the flexible wearable device in communication is improved.

Through the description of the above embodiments, a person skilled in the art can clearly understand that the present disclosure can be realized by software plus necessary hardware platform, and also can be implemented completely by hardware. Based on such understanding, all or part of the technical solutions of the present disclosure contributing to the background art can be embodied in a form of software product. The computer software product can be stored in a storage medium, including a number of instructions for an electronic device (including PAD, cellphone, earphone, wearable device, etc.) to implement the method described in some portions of the respective embodiments or embodiment of the present disclosure.

Finally, it should be indicated that the above mentioned embodiments are merely for illustrating the technical solutions of the present disclosure, rather than limiting the present disclosure. Although the present disclosure is described in detail with reference to the undermentioned embodiments, a person ordinarily skilled in the art should know that the scope of protection of the present disclosure is not limited to this, while modifications or replacements easily envisaged by any one skilled in the art, within the technical scope disclosed in the present disclosure, shall fall within the scope of protection of the present disclosure. Therefore, the scope of protection of the present disclosure should be based on the scope of protection of the claims

What is claimed is:

1. A flexible wearable device, comprising:
a flexible body;
a speaker;
an earpieces;
a sensor; and
a control unit;
wherein, the flexible body is capable of being in a worn state in which a bending angle of the flexible body is not less than a predetermined angle, and in a flattened state in which the bending angle of the flexible body is less than the predetermined angle;
the sensor senses whether the flexible body is in one of the worn state and the flattened state;
when the sensor senses that the flexible body is in the worn state, the control unit controls the earpieces to be off and controls the speaker to be on or as a default sound generator; and when the sensor senses that the flexible body is in the flattened state, the control unit controls the earpieces to be on or as the default sound generator, and controls the speaker to be off.

2. The flexible wearable device of claim 1, wherein the sensor comprises a heart rate sensor for sensing a user's heart rate, when the heart rate sensor senses the user's heart rate, the flexible body is in the worn state, and when the heart rate sensor senses no user's heart rate, the flexible body is in the flattened state.

3. The flexible wearable device of claim 2, wherein the flexible body comprises a first surface and a second surface opposite to the first surface, when the flexible body is in the worn state, the first surface is an outer surface of the flexible body, the second surface is an inner surface of the flexible body, and the heart rate sensor is arranged on the second surface of the flexible body.

4. The flexible wearable device of claim 1, wherein the flexible body comprises a first surface and a second surface opposite to the first surface, when the flexible body is in the worn state, the first surface is an outer surface of the flexible body, the second surface is an inner surface of the flexible body; the flexible body comprises a plurality of hinging bodies hinged with each other, and each of the hinging bodies comprises at least one inclined face facing an adjacent hinging body and adjacent to the second face.

5. The flexible wearable device of claim 4, wherein the sensor comprises a plurality of elastic bodies each arranged on the inclined face, each of the elastic bodies contacts an adjacent hinging body when the flexible body is in the worn state, and a space is defined between each of the elastic bodies and an adjacent hinging body when the flexible body is in the flattened state; the sensor senses whether the flexible body is in one of the flattened state and the worn state through the elastic bodies.

6. The flexible wearable device of claim 1, wherein the sensor comprises a piezoelectric transducer, the piezoelectric transducer is arranged in the flexible body, when a pressure sensed by the piezoelectric transducer is greater than or equal to a predetermined pressure, the flexible body is in the worn state, and when the pressure sensed by the piezoelectric transducer is less than the predetermined pressure, the flexible body is in the flattened state.

7. The flexible wearable device of claim 6, wherein the piezoelectric transducer is arranged at a part of the flexible body that deforms when the worn state and the flattened state are changed.

8. The flexible wearable device of claim 1, wherein the sensor comprises a thin-film resistor arranged in the flexible body, when a change of a resistance value of the thin-film resistor is greater than or equal to a predetermined threshold, the flexible body is in the worn state, and when the change of the resistance value of the thin-film resistor is less than the predetermined threshold, the flexible body is in the flattened state.

9. The flexible wearable device of claim 8, wherein the flexible body comprises a first surface and a second surface opposite to the first surface, when the flexible body is in the worn state, the first surface is an outer surface of the flexible body, and the second surface is an inner surface of the flexible body; the thin-film resistor is arranged at a part of the first surface that deforms when the worn state and the flattened state are changed.

10. The flexible wearable device of claim 1, wherein the flexible body comprises a first surface and a second surface opposite to the first surface, when the flexible body is in the worn state, the first surface is an outer surface of the flexible body, the second surface is an inner surface of the flexible body; the sensor comprises a displacement transducer to sense a displacement quantity of the first surface with respect to the second surface.

11. The flexible wearable device of claim 10, wherein the displacement transducer comprises a reel, a scaling portion, and a sensing portion, the reel is arranged at an end of the flexible body, the scaling portion has one part arranged on the first surface, and another part capable of being wound to the reel or expanded from the reel with the deformation of the flexible body; the sensing portion senses a length of expansion of the scaling portion from the reel, and when the length is greater than or equal to a predetermined length, the flexible body is in the worn state, and when the length is less than the predetermined length, the flexible body is in the flattened state.

12. The flexible wearable device of claim 1, wherein the predetermined angle is an angle defined by a position of one end portion of the flexible body in the flattened state and the same position of the end portion in the worn state with respect to a middle of the flexible body, and the predetermined angle is larger than or equal to 30 degrees.

13. The flexible wearable device of claim 1, wherein the predetermined angle is an angle defined by two end portions of the flexible body with respect to a middle of the flexible body when the flexible body is in the worn state, and the predetermined angle is larger than or equal to 90 degrees.

* * * * *